United States Patent
Iizuka et al.

(10) Patent No.: US 6,987,062 B2
(45) Date of Patent: Jan. 17, 2006

(54) MANUFACTURING METHOD OF SEMICONDUCTOR DEVICE

(75) Inventors: Katsuhiko Iizuka, Gunma (JP); Kazuo Okada, Ota (JP)

(73) Assignee: Sanyo Electric Co., Ltd., Osaka (JP)

(*) Notice: Subject to any disclaimer, the term of this patent is extended or adjusted under 35 U.S.C. 154(b) by 0 days.

(21) Appl. No.: 10/974,971

(22) Filed: Oct. 28, 2004

(65) Prior Publication Data

US 2005/0136603 A1    Jun. 23, 2005

(30) Foreign Application Priority Data

Oct. 29, 2003  (JP)  ............................. 2003-369270

(51) Int. Cl.
  *H01L 21/44*  (2006.01)
  *H01L 21/336* (2006.01)
  *H01L 21/302* (2006.01)

(52) U.S. Cl. .................. 438/682; 438/303; 438/745; 438/529; 438/592; 438/595; 438/756; 438/683

(58) Field of Classification Search .................... None
  See application file for complete search history.

(56) References Cited

U.S. PATENT DOCUMENTS 6,468,915 B1 * 10/2002 Liu .......................... 438/706
6,635,539 B2 * 10/2003 Kwon et al. ............... 438/301

2002/0123181 A1 * 9/2002 Hachisuka ................. 438/197

FOREIGN PATENT DOCUMENTS

| JP | 11-068094  | 3/1999 |
| JP | 11-186545  | 7/1999 |
| JP | 2000-091564 | 3/2000 |

* cited by examiner

*Primary Examiner*—Ha Nguyen
*Assistant Examiner*—Cheung Lee
(74) *Attorney, Agent, or Firm*—Morrison & Foerster LLP

(57) ABSTRACT

This invention offers a manufacturing method which does not cause a reduction in thickness of a silicon substrate or a carbon contamination in forming a transistor having an LDD stricture and silicide layers formed by a salicide technology. After a gate electrode is formed on the silicon substrate through a gate insulation film, an insulation film made of the same material as the gate insulation film is formed on the gate electrode. A first insulation film made of a material different from the material of the gate insulation film and the insulation film on the gate electrode and a second insulation film made of the same material as the material of the gate insulation film and the insulation film on the gate electrode are formed over the silicon substrate. Spacers made of the second insulation film are formed by dry-etching. Then the LDD structure and openings for forming the silicide layers are formed using wet-etching. As a result, the transistor having the LDD structure and the silicide layers formed by the salicide technology is manufactured without causing the reduction in thickness of the silicon substrate or the carbon contamination.

9 Claims, 8 Drawing Sheets

MANUFACTURING METHOD OF SEMICONDUCTOR DEVICE

CROSS-REFERENCE OF THE INVENTION

This invention is based on Japanese Patent Application No. 2003-369270, the content of which is incorporated herein by reference in its entirety.

BACKGROUND OF THE INVENTION

1. Field of the Invention

This invention relates to a method of manufacturing a semiconductor device having an LDD (Lightly Doped Drain) structure, a silicide layer formed by a salicide technology and a spacer formed on a sidewall of a gate electrode.

2. Description of the Related Art

As a manufacturing process of a semiconductor device moves to a finer design rules, there arises a problem that characteristics of a MOS transistor decline due to a short channel effect. A technology called LDD has been developed and used as a countermeasure against the problem. Another problem is resistance increase of a gate electrode and source and drain regions due to reduced dimensions of the gate electrode and the source and drain regions. A technology called salicide is used as a countermeasure against the problem. Silicide layers are formed in a self-aligned manner around surfaces of the gate electrode and the source and drain regions by a reaction between transition metal and silicon in the salicide technology. Many of semiconductor devices in recent years have been manufactured by a combination of these two technologies.

A manufacturing process of the semiconductor device using the combination of the LDD structure and the salicide technology will be briefly described hereafter, referring to FIGS. 8–13.

A gate insulation film 22 is formed on a silicon substrate 21, as shown in FIG. 8. A silicon oxide film is generally used as the gate insulation film 22. A film of a material to make a gate electrode is formed on the gate insulation film 22. The gate electrode 23 is formed through subsequent photolithography and etching. After that, low impurity concentration regions 24 are formed by injecting a low dose of impurities into a surface of the silicon substrate 21, using the gate electrode 23 as a mask.

An insulation film is formed over the silicon substrate 21, as shown in FIG. 9. This insulation film is hereafter referred to as a spacer insulation film 25.

Anisotropic dry-etching of the spacer insulation film 25 and the gate insulation film 22 forms a spacer 26 which is made of the spacer insulation film 25 left on each side surface of the gate electrode 23 after the dry-etching, as shown in FIG. 10.

A buffer film 27 made of an insulation film is formed over the silicon substrate 21, as shown in FIG. 11. A high dose of impurities are injected into the silicon substrate 21 to form high impurity concentration regions 28. After forming the high impurity concentration regions 28, the buffer film 27 is removed by dry-etching.

A transition metal film 29 is formed over the entire surface of the silicon substrate 21, as shown in FIG. 12. Heating the silicon substrate 21 causes a reaction between the transition metal film 29 and silicon in surface portions of the silicon substrate 21 and the gate electrode 23. After removing a portion of the transition metal film 29 which has not reacted with silicon, the silicon substrate 21 is heated again to form silicide layers 30 in the surface portions of the silicon substrate 21 and the gate electrode 23, as shown in FIG. 13.

Although not shown in the figure, the rest of the manufacturing process to complete the semiconductor device including forming an interlayer insulation film, opening contact holes in the high impurity concentration regions and forming metal wirings is well known to a person skilled in the art.

There arise following problems when the semiconductor device having the LDD structure and the silicide layers is manufactured by the method described above.

First, in etching the insulation film to make the spacer 26 and the buffer film 27, usually a gas including carbon such as $CF_4$ or $CHF_3$ is used. This results in residual carbon left on the surface of the silicon substrate 21 and the surface of the gate electrode 23, more specifically in regions about 4 nm deep from the surface. The residual carbon is referred to as a carbon contamination hereafter.

Second, over-etching which takes place in forming the spacer and in removing the buffer film inevitably removes a surface portion of the silicon substrate, as shown in elliptical regions a in FIG. 10 and in elliptical regions b in FIG. 11. As a result, thicknesses of the high and low impurity concentration regions and the silicide layers to be formed later are reduced.

One time of the over-etching removes the surface portion of the silicon substrate by about 7–15 nm, thus two times of the over-etching remove the surface portion of the silicon substrate by about 14–30 nm.

Third, the reaction between the transition metal and silicon is hampered in regions where the carbon contamination has taken place, thus the silicide layer is not formed in elliptical regions c in FIG. 13, leaving non-reacted portions there. Countermeasures against this problem such as plasma treatment on the carbon-contaminated regions and etching to remove the carbon-contaminated regions are described in the aforementioned patents.

Up to 34 nm of the surface portion of the silicon substrate is removed by the over-etching and removing the carbon-contaminated regions as described above. Reducing the thickness by about 34 nm does not cause a major problem when an ordinary silicon substrate is used, since the whole substrate is made of thick silicon.

However, it causes a big problem with a wafer having a thin silicon substrate 21 grown on an insulator 31 as in the case of SOI (Silicon On Insulator) which has been brought into use in recent years, as shown in FIG. 14. Since the silicon substrate 21 on the insulator 31 is as thin as about 50–100 nm, removing the surface portion of the silicon substrate 21 by about 34 nm means a substantial reduction in the thicknesses of the high and low impurity concentration regions and the silicide layers, leading to a decline in characteristics of the transistor. The transistor does not operate in some cases, because the high and low impurity concentration regions and the silicide layers are not thick enough for the transistor to operate.

There is another problem that resistances of the source and drain regions and the gate electrode vary with locations on the wafer, since an etch rate and a selection ratio of the dry-etching vary with the locations on the wafer.

SUMMARY OF THE INVENTION

The invention provides a method of manufacturing a semiconductor device. The method includes forming a gate insulation film on a substrate. The substrate has a top surface portion made of silicon, and the gate insulation film is placed on the top surface portion. The method also includes forming a layer of a gate electrode material on the gate insulation film, forming a gate cover insulation film on the layer of the gate electrode material, forming a gate electrode by patterning the layer of the gate electrode material and the gate cover insulation film, injecting a low dose of a first impurity of a first conductivity type into the substrate using the gate electrode as a mask, forming a first insulation film over the substrate dosed with the first impurity, forming a second insulation film on the first insulation film, and dry-etching the second insulation film to leave only a portion of the second insulation film that is on a side wall of the gate electrode. The left portion of the second insulation film works as a spacer and is placed on a portion of the first insulation film covering the side wall of the gate electrode. The method further includes injecting a high dose of a second impurity of the first conductivity type into the substrate having the spacer, removing by a first wet etching a portion of the first insulation film that is on the gate cover insulation film of the gate electrode and another portion of the first insulation film that is on a portion of the gate insulation film that is not covered by the gate electrode, removing by a second wet etching the spacer, the portion of the gate insulation film that is not covered by the gate electrode and the gate cover insulation film of the gate electrode, forming a transition metal film over the substrate from which the spacer is removed, and inducing a chemical reaction between the transition metal layer and silicon so that a silicide layer is formed in the top surface portion of the substrate and another silicide layer is formed in a surface of the layer of the gate electrode material.

DETAILED DESCRIPTION OF THE INVENTION

A method of manufacturing a semiconductor device according to an embodiment of this invention will be described hereafter, referring to FIGS. 1–7.

Figure 1:
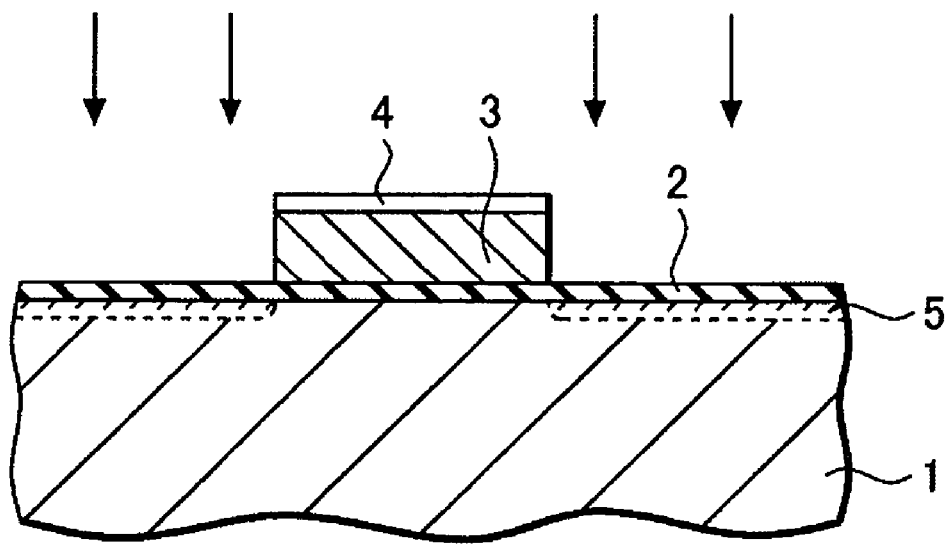
FIG. 1 is a cross-sectional view showing a manufacturing method of a semiconductor device according an embodiment of this invention.

A silicon oxide film of about 5 nm in thickness is formed on a silicon substrate 1 by thermal oxidation, as shown in FIG. 1. It becomes a gate insulation film 2. And a polysilicon film of about 200 nm in thickness and an insulation film such as a silicon oxide film are formed on the gate insulation film 2. A gate electrode 3 made of the polysilicon film and the insulation film 4 stacked on it is formed by shaping the films by photolithography and etching.

After that, a low dose of impurity ions, e.g. phosphorus ions, are injected into the silicon substrate 1 using the gate electrode as a mask. In this process, about $1-5\times10^{14}$ (ions/cm$^2$) of phosphorus ions are injected into surface regions of the silicon substrate 1 about 10 nm deep from the surface of the silicon substrate 1. Subsequent heat treatment such as N$_2$ (nitrogen) annealing diffuses the impurities to form low concentration impurity regions 5.

Figure 2:
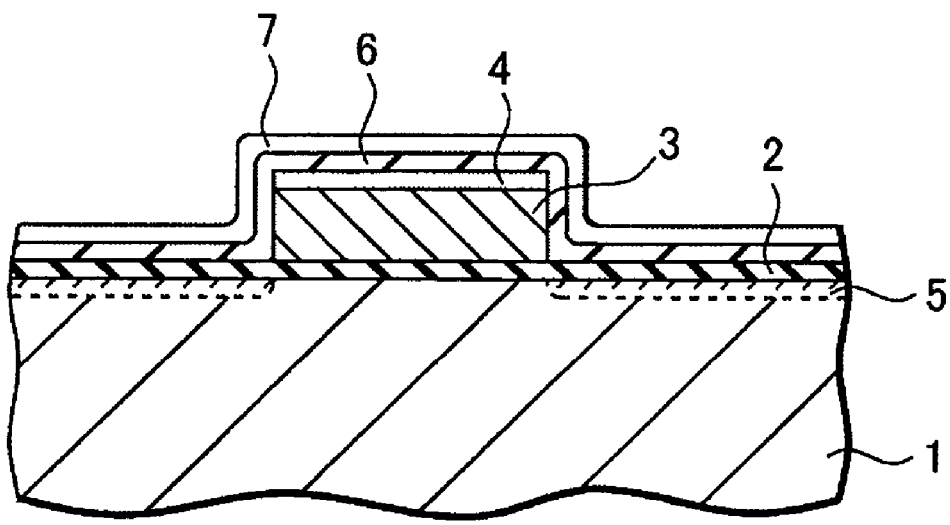
FIG. 2 is a cross-sectional view showing the manufacturing method of the semiconductor device according the embodiment of this invention.

A first insulation film 6 made of about 10 nm thick silicon nitride is formed over the entire surface of the silicon substrate 1, as shown in FIG. 2. In addition, a second insulation film 7 made of about 15–25 nm thick silicon oxide such as HTO (High Temperature Oxide), TEOS (Tetra Ethyl Ortho Silicate) or NSG (Non-doped Silicate Glass) is formed on the first insulation film 6.

Figure 3:
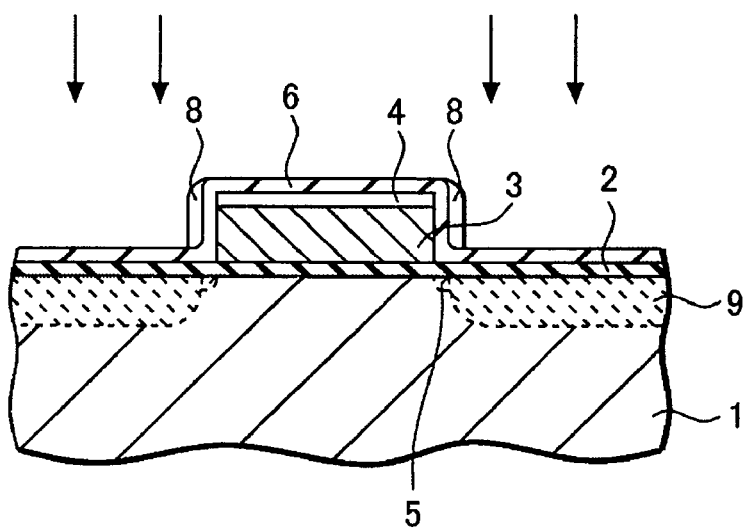
FIG. 3 is a cross-sectional view showing the manufacturing method of the semiconductor device according the embodiment of this invention.

The second insulation film 7, which is the silicon oxide film in this embodiment, is dry-etched. In this process, a spacer 8 made of the second insulation film 7 is formed on each sidewall of the gate electrode 3 through the first insulation film 6, as shown in FIG. 3.

After that, high impurity concentration regions 9 are formed by injecting a high dose of impurity ions of the same conductivity type as the impurities injected into the low impurity concentration regions 5, e.g. arsenic ions, and subsequent heat treatment such as N$_2$ annealing. The dose of the injected impurity ions is about $1-5\times10^{15}$ (ions/cm$^2$) and a depth of the high impurity concentration region before the annealing is about 5–45 nm from the surface of the silicon substrate 1, thus the high impurity concentration regions 9 are formed deeper than the low impurity concentration regions 5. Because of the existence of the first insulation film 6 and the spacer 8 on each side surface of the gate electrode 3, the high impurity concentration region 9 is formed further away from the gate electrode 3 than the low impurity concentration region 5, as shown in FIG. 3. The LDD structure is hereby formed.

Figure 4:
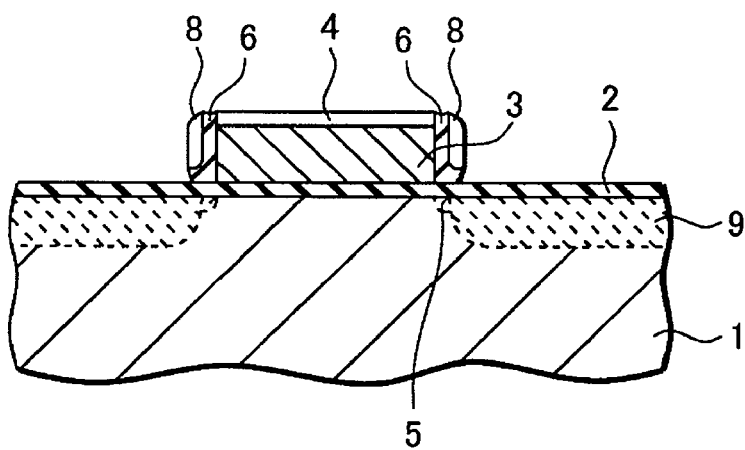
FIG. 4 is a cross-sectional view showing the manufacturing method of the semiconductor device according the embodiment of this invention.

The first insulation film 6 made of the silicon nitride film is wet-etched using a chemical solution primarily composed of phosphoric acid, as shown in FIG. 4. The chemical solution may be made of phosphoric acid only, or phosphoric acid mixed with water or surface-active agent in order to adjust an etch rate or to improve surface wettability.

In this process, only the silicon nitride film over the gate electrode 3 and the silicon nitride film on the gate insulation film 2 are removed, leaving the first insulation film 6 in regions surrounded by the spacer 8, the gate electrode 3 and the gate insulation film 2. It should be noted that the phosphoric acid used in the wet-etching scarcely etch the silicon oxide film which is the material making the insulation film 4 on the gate electrode 3 and the gate insulation film 2. Thus, the phosphoric acid causes no carbon contamination.

Figure 5:
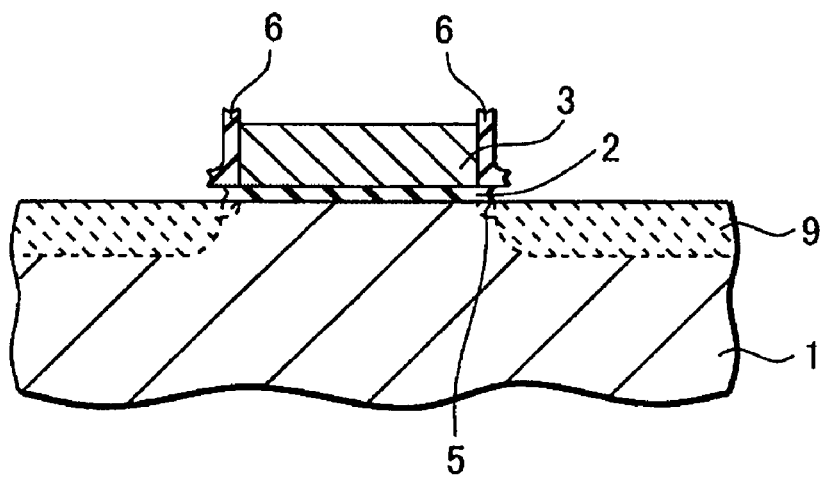
FIG. 5 is a cross-sectional view showing the manufacturing method of the semiconductor device according the embodiment of this invention.

The silicon oxide film 4, the spacer 8 and the gate insulation film 2 not covered with the gate electrode 3 or the first insulation film 6 are removed using a chemical solution primarily made of hydrofluoric acid or buffered hydrofluoric acid, as shown in FIG. 5. Since the hydrofluoric acid and the buffered hydrofluoric acid scarcely etch silicon and do not contain carbon, they do not cause problems such as removing the surface portion of the silicon substrate and the carbon contamination.

Figure 6:
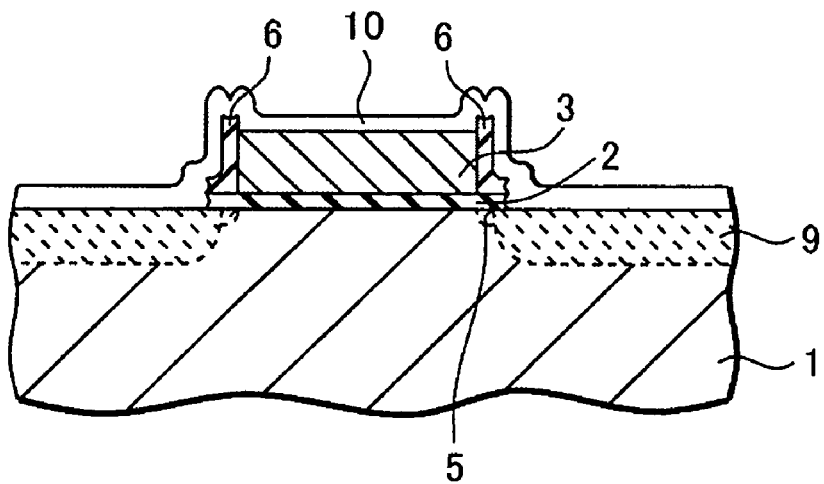
FIG. 6 is a cross-sectional view showing the manufacturing method of the semiconductor device according the embodiment of this invention.

A transition metal film 10 made of one of titanium, cobalt and nickel is formed over the entire surface of the silicon substrate 1, as shown in FIG. 6. Thickness of the film is about 30–40 nm for titanium and about 6–10 nm for cobalt.

The silicon substrate 1 is heated to a temperature at which the transition metal reacts with silicon, as shown in FIG. 7. The temperature is about 700° C. for titanium and about 500° C. for cobalt. After that, the transition metal not reacted with silicon is removed by wet-etching using sulfuric acid or the like. Silicide layers 11 are formed in surface regions of the silicon substrate and the gate electrode 3 by additional heating of the silicon substrate 1.

The rest of the manufacturing process to complete the semiconductor device including forming an interlayer insulation film, opening contact holes and forming metal wirings is well known in the art.

Figure 7A:
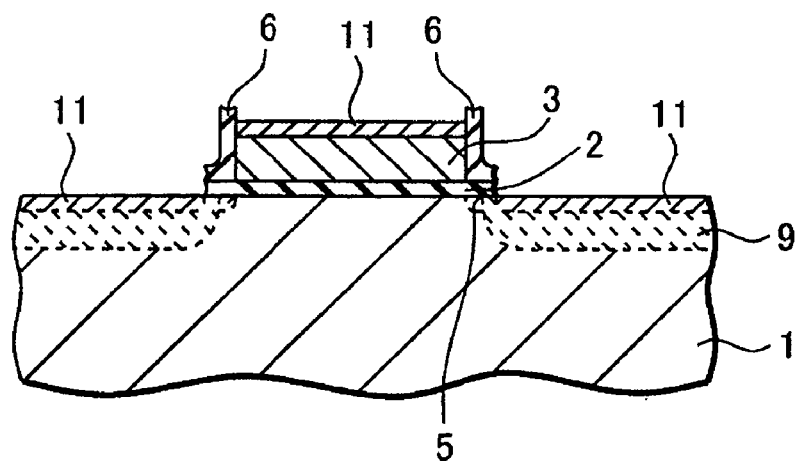
FIG. 7A is a cross-sectional view showing the manufacturing method of the semiconductor device according the embodiment of this invention.
Figure 7B:
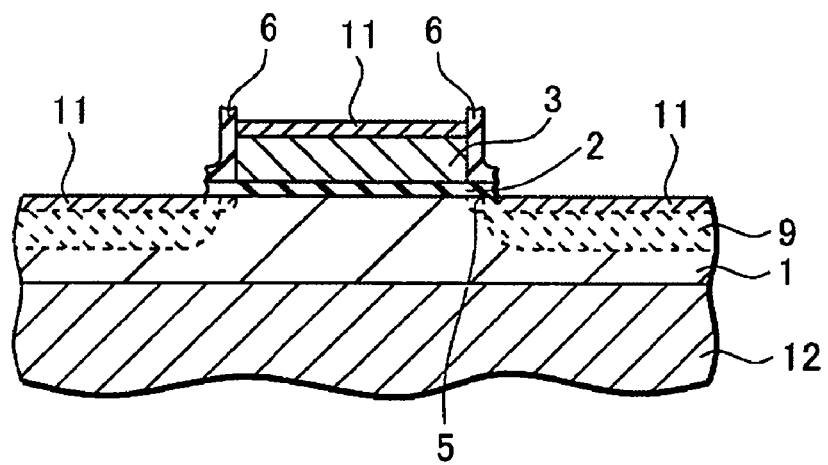
FIG. 7B is a cross-sectional view of s semiconductor device manufactured by the method of the embodiment modified to employ an insulator substrate.
Figure 8:
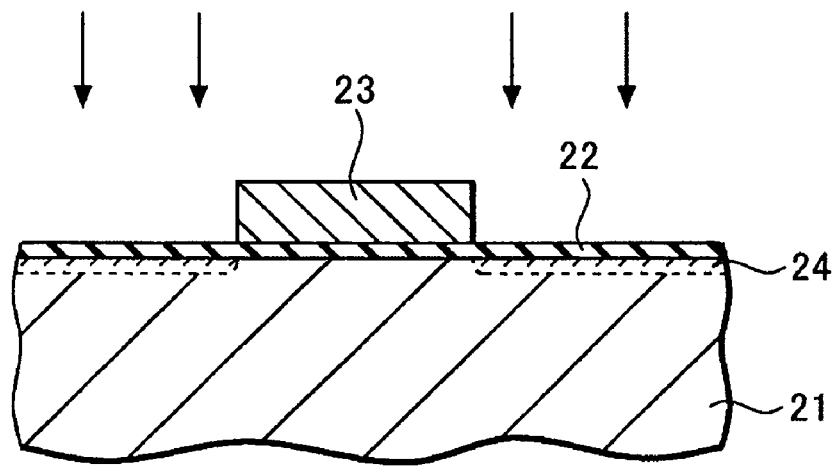
FIG. 8 is a cross-sectional view showing a manufacturing method of a semiconductor device according a prior art.
Figure 9:
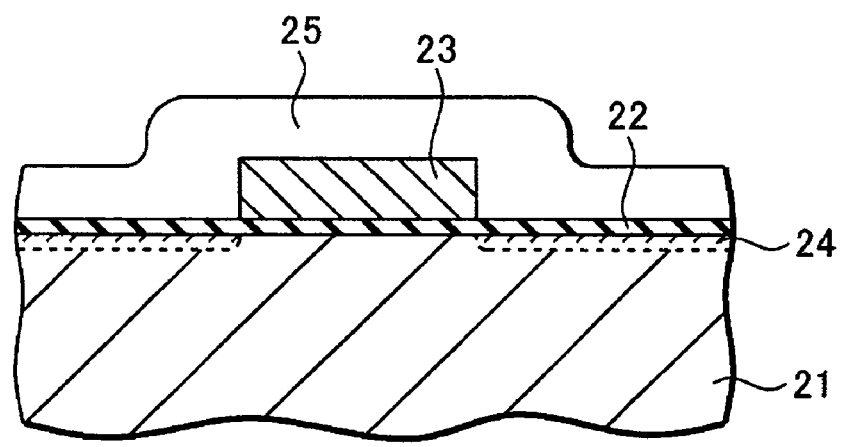
FIG. 9 is a cross-sectional view showing the manufacturing method of the semiconductor device according the prior art.
Figure 10:
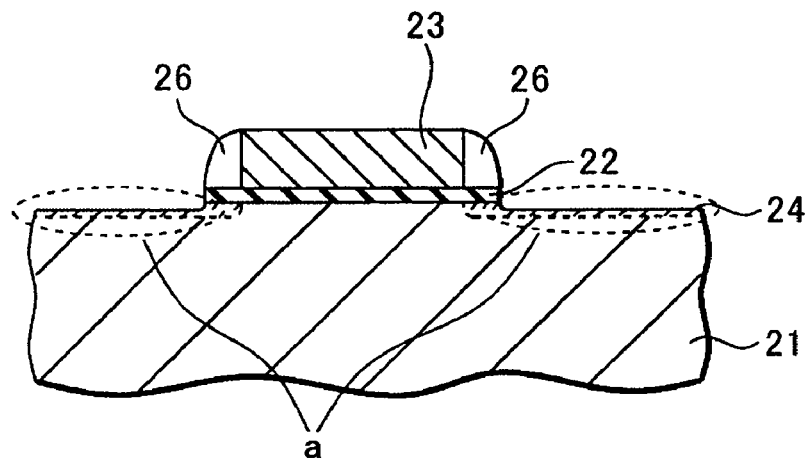
FIG. 10 is a cross-sectional view showing the manufacturing method of the semiconductor device according the prior art.
Figure 11:
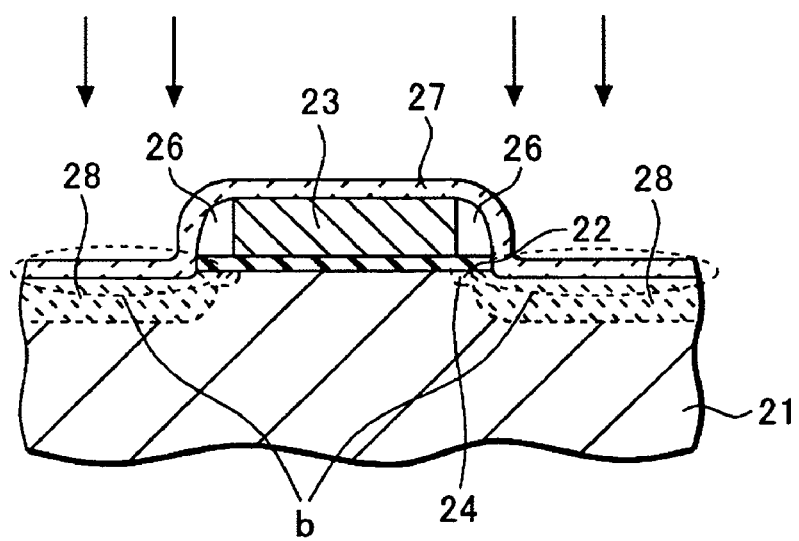
FIG. 11 is a cross-sectional view showing the manufacturing method of the semiconductor device according the prior art.
Figure 12:
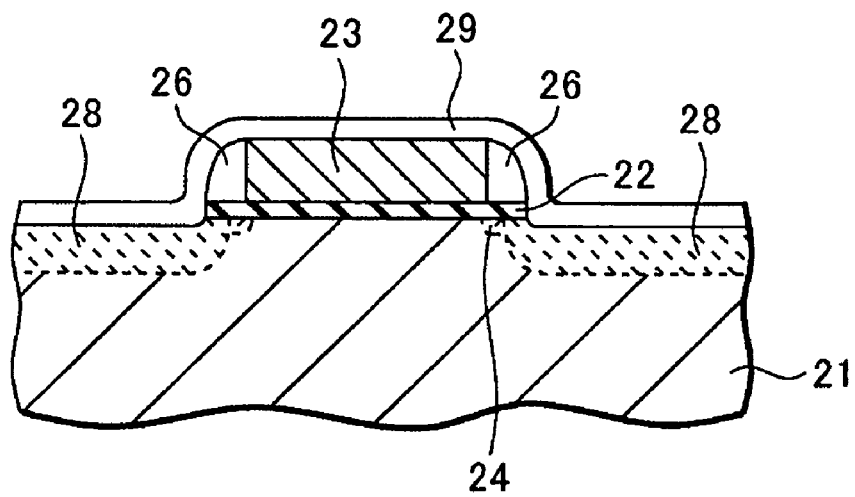
FIG. 12 is a cross-sectional view showing the manufacturing method of the semiconductor device according the prior art.
Figure 13:
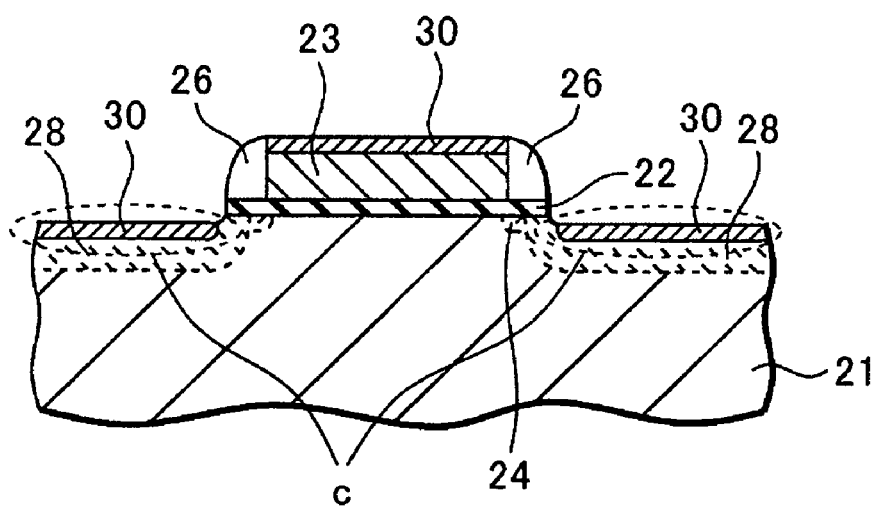
FIG. 13 is a cross-sectional view showing the manufacturing method of the semiconductor device according the prior art.
Figure 14:
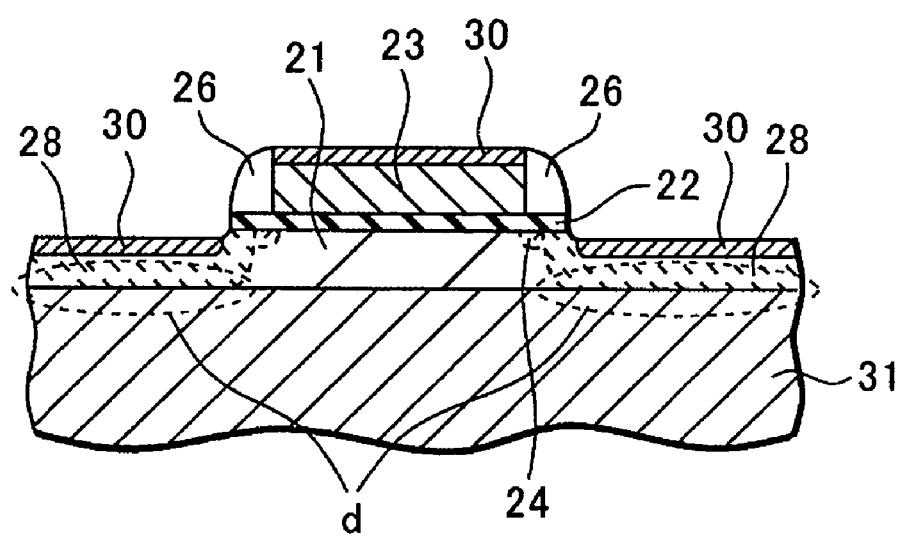
FIG. 14 is a cross-sectional view showing problems in the manufacturing method of the semiconductor device according the prior art.

FIG. 7B shows a semiconductor device manufactured by the method described above except that this method employs a substrate that includes an insulator 12 and a thin silicon layer 1 grown on the insulator 12. All the process steps shown FIGS. 1–7A are applicable to this substrate.

When an 8 nm thick cobalt film is used as the transition metal film to form the silicide film, for example, the thickness of the silicide film comes to be about 32 nm. Therefore, for a substrate having an SOI structure with a silicon film of about 50 nm in thickness grown on an insulator, the conventional art, which reduces the thickness of the silicon substrate by about 30 nm, not only provide insufficient thickness of the silicide, but also eliminate most of the high and low impurity concentration regions, making the transistor inoperable. The manufacturing method of this invention prevents such problems from occurring.

The reduction in the thickness of the silicon substrate and the carbon contamination is prevented by wet-etching using the chemical solution not containing carbon instead of dry-etching, in making openings for impurity injection to form LDD structure and in making openings for forming the silicide layers on the silicon substrate and the gate electrode. As a result, enough thicknesses of the high and low impurity concentration regions and the silicide layers are made available even for the SOI structure in which the silicon substrate is made of thin layer of silicon grown on an insulator. In addition, the variation of the characteristics with locations on a wafer can be suppressed by choosing appropriate chemical solution, because the selection ratio is much larger with the wet-etching than with the dry-etching. Therefore, transistors with more stable characteristics can be manufactured with high yield according to this invention.

It is noted that the method of the embodiment described above includes forming insulation films for a spacer by forming an insulation film made of a material different from a material of a gate insulation film and an insulation film on a gate electrode and forming a second insulation film made of the same material as the material of the gate insulation film. The method also includes using a wet-etching in removing the insulation films to make an opening in a silicide layer.

It should be noted that while N-type impurity ions such as phosphorus ions and arsenic ions are injected to form the low and high impurity concentration regions of N-type in the embodiment, P-type impurity ions such as boron ions are injected when low and high impurity concentration regions of P-type are to be formed.

What is claimed is:

1. A method of manufacturing a semiconductor device, comprising:
    forming a gate insulation film on a substrate, the substrate comprising a top surface portion made of silicon and the gate insulation film being disposed on the top surface portion;
    forming a layer of a gate electrode material on the gate insulation film;
    forming a gate cover insulation film on the layer of the gate electrode material;
    forming a gate electrode by patterning the layer of the gate electrode material and the gate cover insulation film;
    injecting a low dose of a first impurity of a first conductivity type into the substrate using the gate electrode as a mask;
    forming a first insulation film over the substrate dosed with the first impurity;
    forming a second insulation film on the first insulation film;
    dry-etching the second insulation film to leave only a portion of the second insulation film that is on a side wall of the gate electrode, the left portion of the second insulation film working as a spacer and being disposed on a portion of the first insulation film covering the side wall of the gate electrode;
    injecting a high dose of a second impurity of the first conductivity type into the substrate having the spacer;
    removing by a first wet etching a portion of the first insulation film that is on the gate cover insulation film of the gate electrode and another portion of the first insulation film that is on a portion of the gate insulation film that is not covered by the gate electrode;
    removing by a second wet etching the spacer, the portion of the gate insulation film that is not covered by the gate electrode and the gate cover insulation film of the gate electrode;
    forming a transition metal film over the substrate from which the spacer is removed; and
    inducing a chemical reaction between the transition metal layer and silicon so that a silicide layer is formed in the top surface portion of the substrate and another silicide layer is formed in a surface of the layer of the gate electrode material.

2. The method of claim 1, wherein the substrate further comprises an insulator, and the top surface portion is disposed on the insulator.

3. The method of claim 1, wherein the first insulation film comprises silicon nitride.

4. The method of claim 1, wherein the second insulation film comprises silicon oxide.

5. The method of claim 1, wherein the transition metal film comprises titanium, cobalt or nickel.

6. The method of claim 1, wherein the first impurity and the second impurity are a same impurity.

7. The method of claim 1, wherein the first wet etching uses a solution comprising a phosphoric acid.

8. The method of claim 1, wherein the second wet etching uses a solution comprising hydrofluoric acid.

9. A method of manufacturing a semiconductor device, comprising:

- forming a gate insulation film comprising silicon oxide on a substrate comprising a silicon layer grown on an insulator;
- forming a polysilicon film on the gate insulation film;
- forming a gate cover insulation film comprising silicon oxide on the polysilicon film;
- forming a gate electrode by patterning the polysilicon film and the gate cover insulation film;
- injecting a low dose of a first impurity of a first conductivity type into the silicon layer using the gate electrode as a mask;
- forming a first insulation film comprising silicon nitride over the silicon substrate dosed with the first impurity;
- forming a second insulation film comprising silicon oxide on the first insulation film;
- dry-etching the second insulation film to leave only a portion of the second insulation film that is on a sidewall of the gate electrode, the left portion of the second insulation film working as a spacer and being disposed on a portion of the first insulation film covering the sidewall of the gate electrode;
- injecting a high dose of a second impurity of the first conductivity type deeper into the silicon layer than the low dose of the first impurity;
- removing by a first wet etching a portion of the first insulation film that is on the gate cover insulation film of the gate electrode and another portion of the first insulation film that is on a portion of the gate insulation film that is not covered by the gate electrode, the first wet etching using a solution comprising phosphoric acid;
- removing by a second wet etching the spacer, the portion of the gate insulation film that is not covered by the gate electrode and the gate cover insulation film of the gate electrode, the second wet etching using a solution comprising hydrofluoric acid;
- forming a transition metal film comprising titanium, cobalt or nickel over the substrate from which the spacer is removed; and
- inducing a chemical reaction between the transition metal layer and silicon so that a silicide layer is formed in the silicon layer and another silicide layer is formed in a surface of the polysilicon layer of the gate electrode.

* * * * *